United States Patent
Mizutani et al.

(10) Patent No.: US 6,399,269 B2
(45) Date of Patent: Jun. 4, 2002

(54) BOTTOM ANTI-REFLECTIVE COATING MATERIAL COMPOSITION FOR PHOTORESIST AND METHOD OF FORMING RESIST PATTERN USING THE SAME

(75) Inventors: Kazuyoshi Mizutani; Makoto Momota, both of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/397,117

(22) Filed: Sep. 16, 1999

(30) Foreign Application Priority Data

Sep. 24, 1998 (JP) ............................................. 10-270042

(51) Int. Cl.[7] ............................ G03F 7/09; G03F 7/004
(52) U.S. Cl. ................................ 430/270.1; 430/281.1; 430/286.1; 430/338
(58) Field of Search ........................... 430/270.1, 281.1, 430/286.1, 338

(56) References Cited

U.S. PATENT DOCUMENTS

| | | | |
|---|---|---|---|
| 5,652,317 A | | 7/1997 | McCulloch et al. |
| 5,733,714 A | | 3/1998 | McCulloch et al. |
| 5,919,599 A | * | 7/1999 | Meador et al. ........... 430/271.1 |
| 6,117,967 A | * | 9/2000 | Fuller et al. ................. 528/125 |
| 6,143,480 A | * | 11/2000 | Obayashi et al. ............ 430/332 |

FOREIGN PATENT DOCUMENTS

| | | | |
|---|---|---|---|
| EP | 0 542 008 A1 | | 5/1993 |
| EP | 0 763 781 A2 | | 3/1997 |
| EP | 0 813 114 A2 | | 12/1997 |
| EP | 0851300 | * | 7/1998 |
| EP | WO 99 17161 | | 4/1999 |
| EP | WO 99 21058 | | 4/1999 |

* cited by examiner

*Primary Examiner*—Janet Baxter
*Assistant Examiner*—Yvette M Clarke
(74) *Attorney, Agent, or Firm*—Sughrue Mion, PLLC

(57) ABSTRACT

A bottom anti-reflective coating material composition for a photoresist comprising the following components (a) to (d):

(a) a polymer containing a dye structure having a molar extinction coefficient of $1.0 \times 10^4$ or more to light including a wavelength used for exposure of the photoresist;

(b) a thermal crosslinking agent which is activated by an acid to react with component (a) described above, thereby forming a crosslinked structure;

(c) a sulfonic acid ester compound or diaryl iodonium salt, which is decomposed to generate an acid with heating at temperature between 150 to 200° C.; and (d) an organic solvent capable of dissolving components (a) to (c) described above.

The bottom anti-reflective coating material composition for a photoresist provides a bottom anti-reflective coating having a large absorbance to light including a wavelength used for exposure, and an adverse effect due to a standing wave generated by reflection from a substrate can be reduced, a limiting resolution of the photoresist is increased, and a good resist profile is obtained. A method of forming a resist pattern using the composition is also disclosed.

17 Claims, No Drawings

BOTTOM ANTI-REFLECTIVE COATING MATERIAL COMPOSITION FOR PHOTORESIST AND METHOD OF FORMING RESIST PATTERN USING THE SAME

FIELD OF THE INVENTION

The present invention relates to a composition of a bottom anti-reflective coating material for a photoresist capable of forming a bottom anti-reflective coating which is effective in reducing an adverse effect of reflection from a background substrate in a lithography process using various radiations, and to a method of forming a resist pattern using the composition of a bottom anti-reflective coating material.

BACKGROUND OF THE INVENTION

A photoresist is coated on a substrate such as semiconductor wafer, glass, ceramic or metal to have a thickness of from 0.5 to 2 μm by a spin coating method or a roller coating method and thereafter subjected to heating, drying, printing of a circuit pattern through an exposure mask with radiation such as ultraviolet ray, post exposure baking if desired, and development to form an image.

Etching is conducted using the image as a mask so as to effect pattern working on a substrate. Representative examples of the application field thereof include production process of semiconductors such as IC, production of circuit substrates such as liquid crystal and thermal head and other photofabrication process.

In the semiconductor fine working using a photoresist, accompanying the tendency towards finer dimensions, a matter of great importance is the prevention of light reflection from the substrate. For this purpose, a photoresist containing a light absorbent has been conventionally used. However, the use has a problem in that the resolution is impaired. Accordingly, a method of providing a bottom anti-reflective coating (BARC) between the photoresist and the substrate has been extensively investigated. Known examples of the bottom anti-reflective coating include an inorganic coating type such as titanium, titanium dioxide, titanium nitride, chromium oxide, carbon and α-silicon, and an organic coating type comprising a light absorbent and a polymer material.

The former requires equipments such as a vacuum evaporation apparatus, a CVD apparatus and a sputtering apparatus, for the coating formation. The latter is advantageous since it does not require any particular equipment, and a large number of investigations have been made thereon.

For example, JP-B-7-69611 (the term "JP-B" as used herein means an "examined Japanese patent publication") describes a coating comprising a condensate of a diphenylamine derivative with a formaldehyde-modified melamine resin, an alkali-soluble resin and a light absorbent, U.S. Pat. No. 5,294,680 describes a reaction product of a maleic anhydride copolymer with a diamine-type light absorbent, JP-A-6-118631 (the term "JP-A" as used herein means an "unexamined published Japanese patent application") describes a coating comprising a resin binder and a methylolmelamine-base heat cross-linking agent, JP-A-6-118656 describes an acrylic resin-type anti-reflective coating containing within the same molecule a carboxylic acid group, an epoxy group and a light absorbing group, JP-A-8-87115 describes a coating comprising methylolmelamine and a benzophenone-base light absorbent, and JP-A-8-179509 describes a coating obtained by adding a low molecular light absorbent to a polyvinyl alcohol resin.

The material for organic bottom anti-reflective coating preferably has physical properties such that it exhibits a large absorbance to radiations, it is insoluble in a photoresist solvent (not to cause intermixing with a photoresist layer), it is free from diffusion of a low molecular substance from the anti-reflective coating material to the overcoat photoresist layer during the coating or drying with heating, and it has a high dry etching rate as compared with the photoresist. These are also described, for example, in *Proc. SPIE*, Vol. 2195, 225-229 (1994).

Recently, from a standpoint of the rationalization of production process, it has been desired to use a common solvent for coating the bottom anti-reflective coating composition and the resist composition. Thus, an attempt of adding to the bottom anti-reflective coating composition a compound which causes a crosslinking reaction by heating and hardens the coating to prevent the occurrence of intermixing with the resist layer has been made as described, for example, in JP-A-6-118631 and U.S. Pat. No. 5,693,691.

However, the compounds described in the above-described patents fail to satisfy all these requirements and improvements have been demanded. For example, some conventional bottom anti-reflective coatings are insufficient in the light absorbing power of the binder and require separate loading of a light absorbent, and some contain a large amount of an aromatic light absorbent for increasing the absorbance have a problem of the occurrence of intermixing with the resist layer through interface of the light absorbent. Further, those having, in the crosslinking system, a functional group capable of increasing alkali permeability such as a carboxylic acid group, are accompanied by a problem in that when development with an alkaline aqueous solution is performed, the anti-reflective coating swells to incur deterioration of a resist pattern shape.

SUMMARY OF THE INVENTION

Therefore, an object of the present invention is to provide a bottom anti-reflective coating material composition for a photoresist, which is capable of forming a bottom anti-reflective coating having a large absorbance to light including a wavelength used for exposure, which does not cause intermixing with a photoresist, and which can reduce an adverse effect due to a standing wave generated by reflection from a substrate.

Another object of the present invention is to provide a bottom anti-reflective coating material composition for a photoresist, which is capable of forming a bottom anti-reflective coating that can increase a limiting resolution of the photoresist and provide a good resist profile.

A further object of the present invention is to provide a method of forming a resist pattern, which is capable of forming an excellent resist pattern.

Other objects of the present invention will become apparent from the following description.

These objects of the present invention are accomplished with the bottom anti-reflective coating material composition for a photoresist and method of forming a resist pattern described below.

(1) a bottom anti-reflective coating material composition for a photoresist comprising the following components (a) to (d):

(a) a polymer containing a dye structure having a molar extinction coefficient of $1.0 \times 10^4$ or more to light including a wavelength used for exposure of the photoresist;

(b) a thermal crosslinking agent which is activated by an acid to react with component (a) described above, thereby forming a crosslinked structure;

(c) a sulfonic acid ester compound or diaryl iodonium salt, which is decomposed to generate an acid with heating at temperature between 150 to 200° C.; and (d) an organic solvent capable of dissolving components (a) to (c) described above;

(2) a bottom anti-reflective coating material composition for a photoresist as described in item (1) above, wherein the polymer of component (a) has a glass transition temperature of from 80 to 180° C.;

(3) a bottom anti-reflective coating material composition for a photoresist as described in item (1) or (2) above, wherein the polymer of component (a) contains a repeating unit having the dye structure in an amount of 10% by weight or more;

(4) a bottom anti-reflective coating material composition for a photoresist as described in any one of items (1) to (3) above, wherein the dye structure in the polymer of component (a) is a structure represented by the following formula (I) or (II);

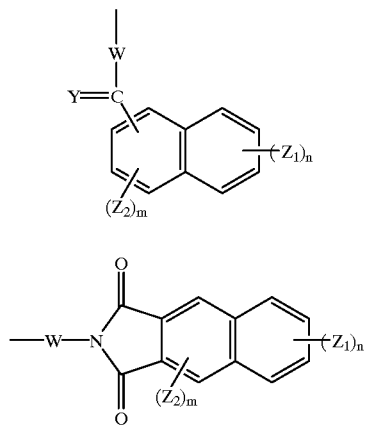

wherein W represents a linking group to the polymer main chain; Y represents an oxygen atom, a sulfur atom or =N—V; $Z_1$ and $Z_2$, which may be the same or different, each represents an electron donating group; m and n represent an integer of from 0 to 2 and from 0 to 3, respectively, and when m and n each is 2 or 3, the $Z_1$ groups or $Z_2$ groups may be the same or different; and V represents a hydroxy group, an amino group, a straight chain, branched or cyclic alkyl group having from 1 to 20 carbon atoms which may have a substituent, an aromatic or heteroaromatic ring group having from 5 to 14 carbon atoms which may have a substituent or an alkoxy group having from 1 to 20 carbon atoms;

(5) a bottom anti-reflective coating material composition for a photoresist as described in item (4) above, wherein the polymer of component (a) is a polymer containing a repeating unit represented by the following formula (IA) or (IIA):

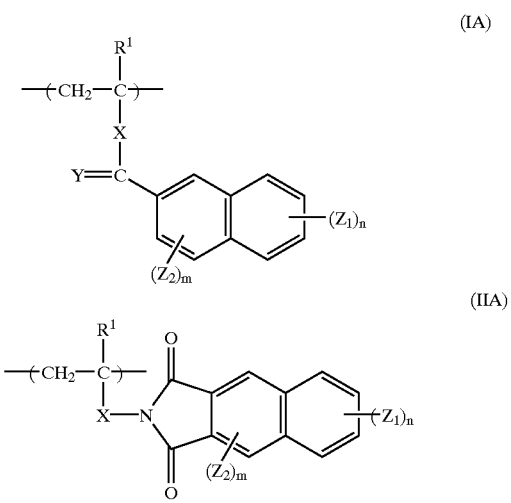

wherein $R^1$ represents a hydrogen atom, a methyl group, a chlorine atom, a bromine atom or a cyano group; X represents a divalent linking group; and Y, $Z_1$, $Z_2$, m and n have the same meanings as defined in formulae (I) and (II), respectively;

(6) a bottom anti-reflective coating material composition for a photoresist as described in item (5) above, wherein $Z_1$ and $Z_2$ in formula (IA) or (IIA), which may be the same or different, each represents a hydroxy group, —$OR_4$ (wherein $R_4$ represents a hydrocarbon group having from 1 to 20 carbon atoms), —$SR_4$ or —$NR_5R_6$ (wherein $R_5$ and $R_6$, which may be the same or different, each represents a hydrogen atom or a hydrocarbon group having from 1 to 20 carbon atoms);

(7) a bottom anti-reflective coating material composition for a photoresist as described in any one of items (1) to (6) above, wherein the thermal crosslinking agent of component (b) is a melamine, benzoguanamine, glycoluril or urea compound substituted with at least one substituent selected from a methylol group, an alkoxymethyl group and an acyloxymethyl group;

(8) a bottom anti-reflective coating material composition for a photoresist as described in item (7), wherein the thermal crosslinking agent of component (b) is a compound selected from hexamethoxymethylmelamine, tetramethoxymethylbenzoguanamine and tetramethoxymethyl-glycoluril;

(9) a bottom anti-reflective coating material composition for a photoresist as described in any one of items (1) to (8), wherein the compound of component (c) is a salt of a diaryliodonium cation and an organic sulfonic acid anion, or an organic sulfonic acid ester having from 3 to 20 carbon atoms;

(10) a bottom anti-reflective coating material composition for a photoresist comprising the following components (a'), (b) and (d):

(a') a polymer containing a repeating unit including a dye structure having a molar extinction coefficient of 1.0× $10^4$ or more to light including a wavelength used for exposure of the photoresist and a repeating unit including a sulfonic acid ester structure or diaryl iodonium structure, which is decomposed to generate an acid with heating at temperature between 150 to 200° C.;

(b) a thermal crosslinking agent which is activated by an acid to react with component (a') described above, thereby forming a crosslinked structure; and (c) an organic solvent capable of dissolving components (a') and (b) described above; and

(11) a method of forming a resist pattern comprising employing the bottom anti-reflective coating material composition for a photoresist as described in any one of items (1) to (10).

DETAILED DESCRIPTION OF THE INVENTION

The bottom anti-reflective coating material composition for a photoresist according to the present invention will be described in detail below.

Component (a) in the composition is a polymer (hereinafter also referred to as polymer (a) sometimes) containing a dye structure necessary for exhibiting the anti-reflective function. The dye structure has a molar extinction coefficient as large as $1.0 \times 10^4$ or more, preferably $4.0 \times 10^4$ or more to light including a wavelength used for exposure of the photoresist. For instance, in case of using a KrF excimer laser (wavelength of 248 nm) as an exposure light source, the dye structure satisfying the above described condition as to the molar extinction coefficient includes an anthracene structure, a phenanthrene structure, a benzophenone (which may have a hydroxy group as a substituent) structure, a naphthalene-carbonyl structure, and the like.

Among these structures, the structure represented by the above described formula (I) or (II) is preferred, since it is excellent in a dry etching property as well as it fulfills the above described condition as to the molar extinction coefficient to light used for exposure, e. g., a KrF excimer laser (wavelength of 248 nm) or a ArF excimer laser (wavelength of 193 nm).

In formula (I) or (II), W represents a linking group to the polymer main chain. More specifically, the linking group preferably includes a single bond, —$CO_2$—, —NH—, —CONH—, —O—, —CO—, —$SO_2$—, a straight chain alkylene group having from 1 to 20 carbon atoms which may have a substituent, a branched alkylene group having from 1 to 20 carbon atoms which may have a substituent and an alkylene group having from 1 to 20 carbon atoms which may have a cyclic alkylene structure. Also, linking groups composed of a combination of two or more of these linking groups are preferably used as W.

Suitable examples of the straight chain alkylene group having from 1 to 20 carbon atoms include a methylene group, an ethylene group, a propylene group, a butylene group, a pentylene group and a hexylene group.

Suitable examples of the alkylene group having from 1 to 20 carbon atoms which may have a cyclic alkylene structure include a cyclohexylene group, a cyclopentylene group and a cyclobutylene group.

Suitable examples of the substituent for the above described alkylene group include an alkyl group having from 1 to 10 carbon atoms, —OH, —$OR_4$ (wherein $R_4$ represents an alkyl group having from 1 to 20 carbon atoms), —$SR_4$, —$NR_5R_6$ (wherein $R_5$ and $R_6$, which may be the same or different, each represents a hydrogen atom or an alkyl group having from 1 to 20 carbon atoms) and a halogen atom.

Preferred examples of W include —O—, —$CO_2C_2H_4O$—, —$CONHC_2H_4O$—, —$CO_2C_2H_4NH$—, —$CONHC_2H_4NH$—, —$CO_2CH_2CH(OH)CH_2O$— and —$CONHCH_2CH(OH)CH_2O$—.

In formula (I), Y represents an oxygen atom, a sulfur atom or =N—V wherein V represents a hydroxy group, an amino group, a straight chain, branched or cyclic alkyl group having from 1 to 20 carbon atoms which may have a substituent, an aromatic or heteroaromatic ring group having from 5 to 14 carbon atoms which may have a substituent or an alkoxy group having from 1 to 20 carbon atoms.

Suitable examples of the straight chain, branched or cyclic alkyl group having from 1 to 20 carbon atoms which may have a substituent include a methyl group, an ethyl group, an n-propyl group, an isopropyl group, an n-butyl group, an isobutyl group, a tert-butyl group, an n-pentyl group, an n-hexyl group, a cyclohexyl group, an n-octyl group, a 2-ethylhexyl group, an n-nonyl group, an n-decyl group, an n-lauryl group, an n-stearyl group, a 2-hydroxyethyl group, a 2,3-dichloropropyl group and a 2,3-dibromopropul group.

Suitable examples of the aromatic or heteroaromatic ring group having from 5 to 14 carbon atoms which may have a substituent include a phenyl group, a naphthyl group, an anthryl group and a phenanthryl group.

Suitable examples of the alkoxy group having from 1 to 20 carbon atoms include a methoxy group, an ethoxy group, an n-propoxy group, an isopropoxy group, an n-butoxy group, a tert-butoxy group, a phenoxy group and a benzyloxy group.

Preferred examples of Y include an oxygen atom, a sulfur atom and —N(OH)—. An oxygen atom is particularly preferred.

In formula (I) or (II), $Z_1$ and $Z_2$, which may be the same or different, each represents an electron donating group. The electron donating group is preferably a group having a Hammett's substituent constant $\sigma_P$ of a negative value. In formula (I) or (II), m and n represent an integer of from 0 to 2 and from 0 to 3, respectively, and when m and n each is 2 or 3, the $Z_1$ groups or $Z_2$ groups may be the same or different.

The electron donating group for $Z_1$ and $Z_2$ preferably includes —OH, —$OR_4$ (wherein $R_4$ represents an alkyl group having from 1 to 20 carbon atoms) or —$NR_5R_6$ (wherein $R_5$ and $R_6$, which may be the same or different, each represents a hydrogen atom or an alkyl group having from 1 to 20 carbon atoms). These groups each has the Hammett's substituent constant $\sigma_P$ in a range of from −0.9 to −0.2.

Preferred examples of the alkyl group having from 1 to 20 carbon atoms for $R_4$, $R_5$ and $R_6$ include a methyl group, an ethyl group, an n-propyl group, an isopropyl group, an n-butyl group, an isobutyl group, a tert-butyl group, an n-pentyl group, an n-hexyl group, a cyclohexyl group, an n-octyl group, a 2-ethylhexyl group, an n-nonyl group, an n-decyl group, an n-lauryl group and an n-stearyl group. In order to prevent the reduction in a dry etching rate, a straight chain or branched alkyl group having from 1 to 6 carbon atoms, for example, a methyl group, an ethyl group, an n-propyl group, an isopropyl group, an n-butyl group, an isobutyl group, a tert-butyl group, an n-pentyl group and an n-hexyl group, a 2-hydroxyethyl group, an allyl group, a 2,3-dichloropropyl group and a 2,3-dibromopropul group are particularly preferred.

Polymer (a) preferably has a glass transition temperature of from 80 to 180° C. in view of a coating ability, film-forming property and thermal crosslinking property. When the glass transition temperature of polymer (a) is lower than 80° C., a problem of intermixing may tend to occur due to disturbance of interface resulting from baking at the application of a resist composition. On the other hand, if the glass transition temperature of polymer (a) is higher than 180° C., it may be difficult to form a uniform coating. Also, a thermal crosslinking property, specifically, diffusibility of an acid formed from a thermally acid-generating agent of component (c) described in detail hereinafter is adversely affected and thus, the problem of intermixing may again tend to occur.

It is preferred that the polymer (a) dose not include an aromatic carbon ring other than the dye structure described above in the main chain thereof in view of preventing from the reduction in a dry etching rate. Specifically, the main chain of polymer (a) is preferably a vinyl polymer chain formed, e.g., from a (meth)acrylate, a (meth)acrylamide, a vinyl ester or a vinyl ether, a non-aromatic polyester chain, a non-aromatic polyurethane chain, a non-aromatic polyamide chain, a non-aromatic polyether chain or a non-aromatic polysulfone chain.

A polymer containing a repeating unit represented by the following formula (IA) or (IIA) is preferred, since it is simply synthesized and has a large film absorbance, good solubility to a solvent and good dry etching property:

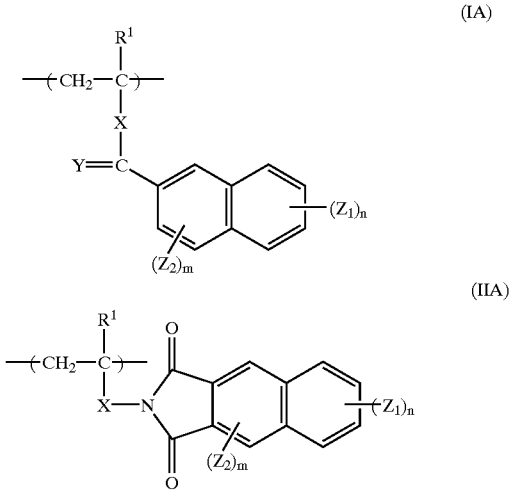

In the above formulae, $R^1$ represents a hydrogen atom, a methyl group, a chlorine atom, a bromine atom or a cyano group.

X in the formulae represents a divalent linking group, preferably —$CO_2$—, —CONH—, —O—, —CO—, —$SO_2$—, —NH—, —$NR_4$—, a straight chain alkylene group having from 1 to 20 carbon atoms which may have a substituent, a branched alkylene group having from 1 to 20 carbon atoms which may have a substituent and a combination of two or more thereof. Suitable examples of the substituent for the above described straight chain or branched alkylene group include an alkyl group having from 1 to 10 carbon atoms, —OH, —$OR_4$ (wherein $R_4$ represents an alkyl group having from 1 to 20 carbon atoms), —$SR_4$, —$NR_5R_6$ (wherein $R_5$ and $R_6$, which may be the same or different, each represents a hydrogen atom or an alkyl group having from 1 to 20 carbon atoms) and a halogen atom.

Particularly, —$CO_2$-(a straight chain alkylene group having from 1 to 8 carbon atoms which may have a substituent)-O—, —CONH-(a straight chain alkylene group having from 1 to 8 carbon atoms which may have a substituent)-O—, —$CONR_4$-(a straight chain alkylene group having from 1 to 8 carbon atoms which may have a substituent)-O—, —$CO_2$-(a straight chain alkylene group having from 1 to 8 carbon atoms which may have a substituent)-NH—, —CONH-(a straight chain alkylene group having from 1 to 8 carbon atoms which may have a substituent)-NH— and —$CONR_4$-(a straight chain alkylene group having from 1 to 8 carbon atoms which may have a substituent)-$NR_5$— are preferred, since these are easily synthesized. In the above formulae, $R_4$, $R_5$ and $R_6$ have the same meanings as described above, respectively.

In the formulae (IA) and (IIA), Y, $Z_1$, $Z_2$, m and n have the same meanings as defined in formulae (I) and (II) above, respectively. When m and n each is 2 or 3, the $Z_1$ groups or $Z_2$ groups may be the same or different.

Specific preferred examples of the repeating unit represented by formula (IA) or (IIA) are set forth below, but the present invention should not be construed as being limited thereto.

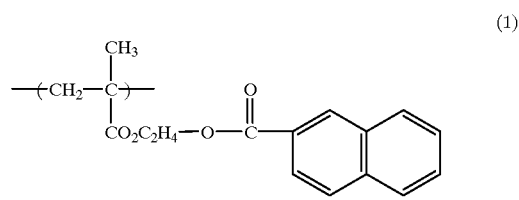

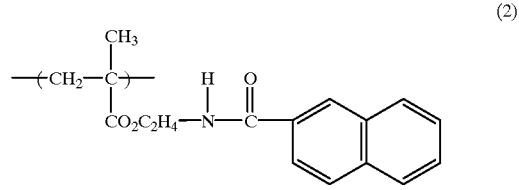

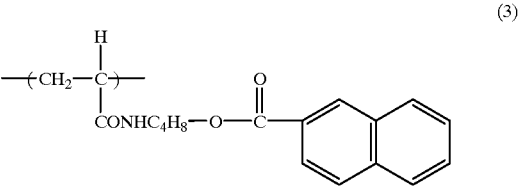

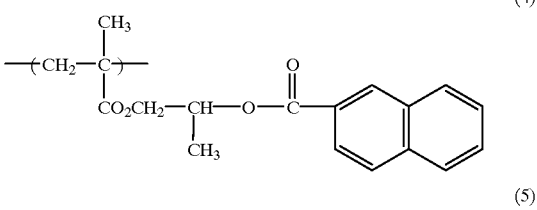

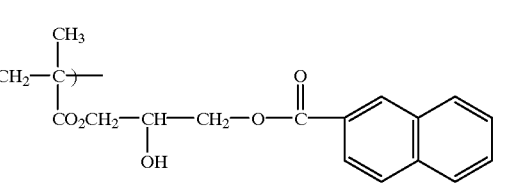

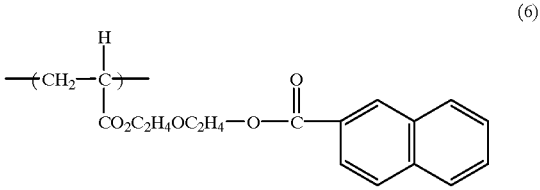

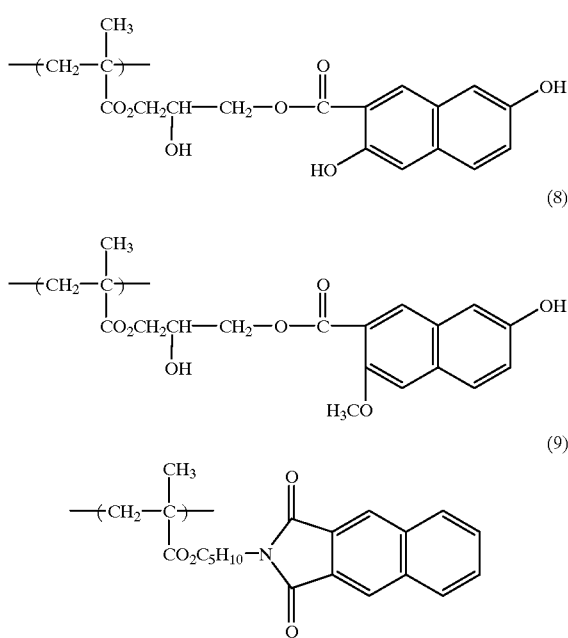

Polymer (a) used in the composition according to the present invention may include a repeating unit of a non-light-absorbing monomer in addition to the repeating unit represented by formula (IA) or (IIA) in order to minutely control a dry etching rate, a reflectivity or the like.

Examples of the non-light-absorbing monomer include compounds having an addition-polymerizable unsaturated bond, for example, an acrylic ester, a methacrylic ester, an acrylamide, a methacrylamide, an allyl compound, a vinyl ether, a vinyl ester, a styrene and a crotonic ester. Specific examples thereof include:

Acrylic esters such as an alkyl acrylate (the alkyl group preferably having from 1 to 10 carbon atoms) (e.g., methyl acrylate, ethyl acrylate, propyl acrylate, tert-butyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, and tetrahydrofurfuryl acrylate) and an aryl acrylate (e.g., phenyl acrylate, and hydroxyphenyl acrylate);

methacrylic esters such as an alkyl methacrylate (the alkyl group preferably having from 1 to 10 carbon atoms) (e.g., methyl methacrylate, ethyl methacrylate, propyl methacrylate, isopropyl methacrylate, tert-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and tetra-hydrofurfuryl methacrylate) and an aryl methacrylate (e.g., phenyl methacrylate, hydroxyphenyl methacrylate, cresyl methacrylate, and naphthyl methacrylate);

acrylamides such as acrylamide, an N-alkylacrylamide (the alkyl group having from 1 to 10 carbon atoms and examples thereof including a methyl group, an ethyl group, a propyl group, a butyl group, a tert-butyl group, a heptenyl group, an octyl group, a cyclohexyl group, a benzyl group, a hydroxyethyl group and a benzyl group), an N-arylacrylamide (examples of the aryl group including a phenyl group, a tolyl group, a nitrophenyl group, a naphthyl group, a cyanophenyl group, a hydroxyphenyl group and a carboxyphenyl group), an N,N-dialkylacrylamide (the alkyl group having from 1 to 10 carbon atoms and examples thereof including a methyl group, an ethyl group, a butyl group, an isobutyl group, an ethylhexyl group and a cyclohexyl group), an N,N-arylacrylamide (examples of the aryl group including a phenyl group), N-methyl-N-phenylacrylamide, N-hydroxyethyl-N-methylacrylamide and N-2-acetoamidoethyl-N-acetylacrylamide;

methacrylamides such as methacrylamide, an N-alkylmethacrylamide (the alkyl group having from 1 to 10 carbon atoms and examples thereof including a methyl group, an ethyl group, a tert-butyl group, an ethylhexyl group, a hydroxyethyl group and a cyclohexyl group), an N-arylmethacrylamide (examples of the aryl group include a phenyl group, a hydroxyphenyl group and a carboxyphenyl group), an N,N-dialkylmethacrylamide (examples of the alkyl group including an ethyl group, a propyl group and a butyl group), an N,N-diarylmethacrylamide (examples of the aryl group include a phenyl group), N-hydroxyethyl-N-methylmethacrylamide, N-methyl-N-phenylmethacrylamide and N-ethyl-N-phenylmethacrylamide;

allyl compounds such as an allyl ester (e.g., allyl acetate, allyl caproate, allyl caprylate, allyl laurate, allyl palmitate, allyl stearate, allyl benzoate, allyl acetoacetate, and ally lactate) and allyloxyethanol;

vinyl ethers such as an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethypropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether), a vinylaryl ether (e.g., vinylphenyl ether, vinyltolyl ether, vinylchlorophenyl ether, vinyl-2,4-dichlorophenyl ether, vinylnaphthyl ether, and vinylanthranyl ether);

vinyl esters such as vinyl butyrate, vinyl isobutyrate, vinyltrimethyl acetate, vinyldiethyl acetate, vinyl valerate, vinyl caproate, vinyl chloroacetate, vinyl dichloroacetate, vinylmethoxy acetate, vinylbutoxy acetate, vinylphenyl acetate, vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate and vinyl naphthoate;

styrenes such as styrene, an alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, and acetoxymethylstyrene), an alkoxy-styrene (e.g., methoxystyrene, 4-methoxy-3-methylstyrene, and dimethoxystyrene), a halogenated styrene (e.g., chlorostyrene, dichlorostyrene, trichlorostyrene, tetra-chlorostyrene, pentachlorostyrene, bromostyrene, dibromo-styrene, iodostyrene, fluorostyrene, trifluorostyrene, 2-bromo-4-trifluoromethylstyrene, and 4-fluoro-3-trifluoromethylstyrene), a hydroxystyrene (e.g., 4-hydroxy-styrene, 3-hydroxystyrene, 2-hydroxystyrene, 4-hydroxy-3-methylstyrene, 4-hydroxy-3,5-dimethylstyrene, 4-hydroxy-3-methoxystyrene, and 4-hydroxy-3-(2-hydroxybenzyl)styrene), and carboxystyrene;

crotonic acid esters such as an alkyl crotonate (e.g., butyl crotonate, hexyl crotonate, and glycerol mono-crotonate);

dialkyl itaconates (e.g., dimethyl itaconate, diethyl itaconate, and dibutyl itaconate);

dialkyl esters of maleic acid or fumaric acid (e.g., dimethyl maleate, and dibutyl fumarate) or monoalkyl esters of maleic acid or fumaric acid;

acrylic acid, methacrylic acid, crotonic acid, itaconic acid, maleic anhydride, maleimide, acrylonitrile, methacrylonitrile and maleylonitrile. In addition, an addition-polymerizable unsaturated compound capable of copolymerization with the repeating unit for use in the present invention may be used. The non-light-absorbing monomers can be employed individually or in a combination of two or more thereof.

Among these, in view of the capability of intensifying the thermal cross-linking property of polymer (a), monomers having a hydroxy group, for example, 2-hydroxyethyl (meth)acrylate, 2-hydroxypropyl (meth)acrylate, ethylene glycol mono(meth)acrylate, polyethylene glycol mono (meth)acrylate, propylene glycol mono(meth)acrylate and polypropylene glycol mono(meth)acrylate, corresponding (meth)acrylamide monomers having the hydroxy group-containing moiety on the nitrogen atoms, vinyl alcohol, hydroxystyrene and hydroxymethylstyrene are preferred.

From the standpoint that good solubility of the polymer to a solvent can be maintained without the reduction of a dry etching rate, an alkyl (meth)acrylate monomer containing the alkyl group having from 1 to 10 carbon atoms is also preferred.

Further, polymer (a) may contain a crosslinking group in the polymer chain thereof. For example, polymer (a) may contain a repeating unit having a crosslinking group, represented by the following formula (A), (B) or (C):

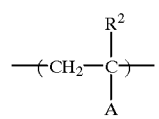

(A)

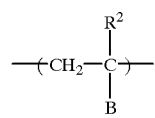

(B)

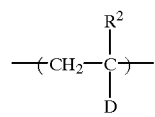

(C)

In formulae (A), (B) and (C), $R^2$ represents a hydrogen atom, a methyl group, a chlorine atom, a bromine atom or a cyano group, and A represents a functional group having a —$CH_2OH$, —$CH_2OR^{14}$ or —$CH_2OCOCH_3$ terminal group (wherein $R^{14}$ represents a hydrocarbon group having from 1 to 20 carbon atoms). A is preferably —$CONHCH_2OH$, —$CONHCH_2OCH_3$, —$CH_2OCOCH_3$, —$C_6H_4CH_2OH$, —$C_6H_4CH_2OCH_3$ or a group resulting from a reaction of —$CONHC(CH_3)_2CH_2COCH_3$ with formalin.

B represents a functional group having a —$CO_2H$ terminal group, preferably —$CO_2H$ or —$C_6H_4CO_2H$.

D represents a functional group having an epoxy terminal group, preferably a group shown below:

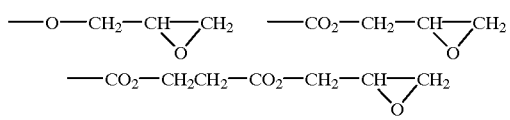

In polymer (a), the content of the repeating unit having the dye structure (preferably the repeating unit having the dye structure represented by formula (I) or (II)) is preferably from 10 to 100% by weight, more preferably from 30 to 97% by weight, and yet more preferably from 50 to 95% by weight.

The content of the unit derived from a non-light-absorbing monomer in polymer (a) is preferably from 0 to 50% by weight, more preferably from 10 to 30% by weight.

The content of the unit derived from a monomer having a crosslinking group in polymer (a) is preferably from 0 to 50% by weight, more preferably from 10 to 30% by weight.

Specific examples of the polymer used in the present invention are set forth below, but the present invention should not be construed as being limited thereto.

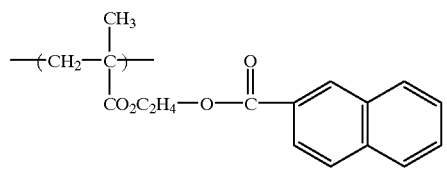

(11)

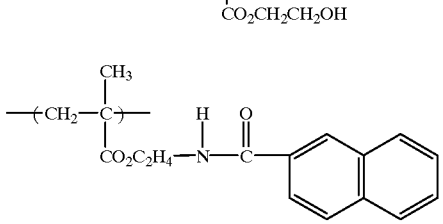

(12)

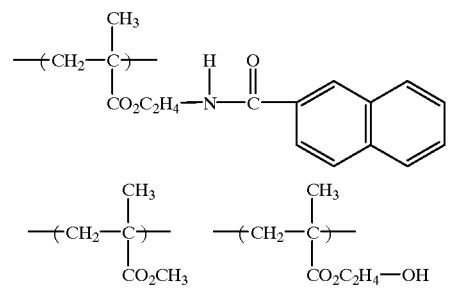

(13)

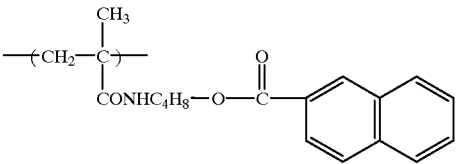

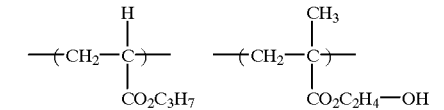

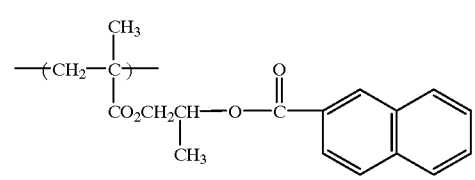
(14)
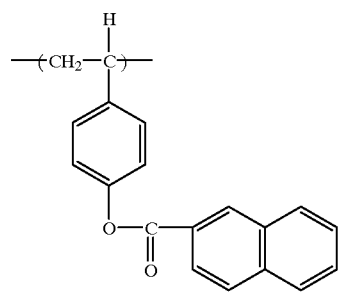
(19)
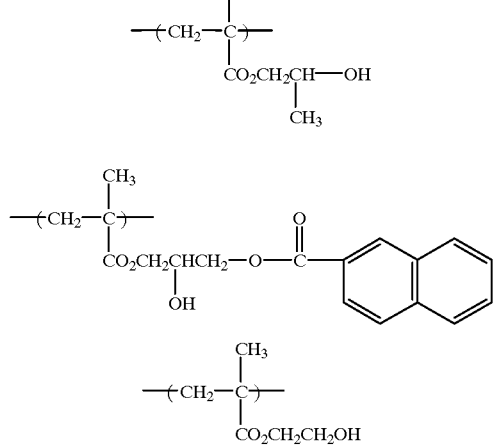
(15)
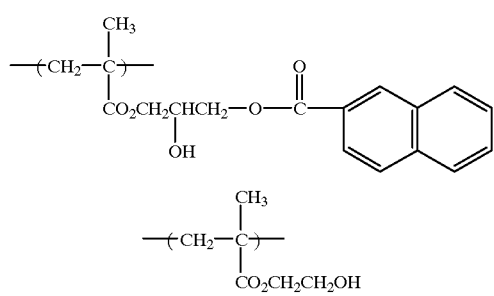
(16)
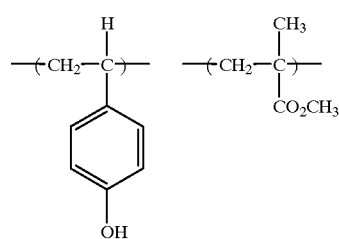
(20)
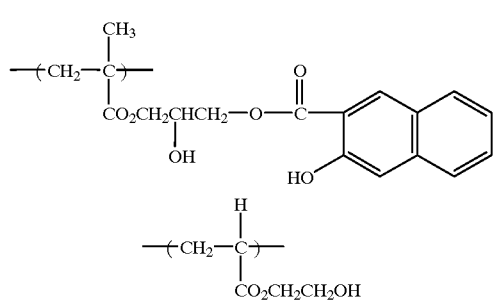
(17)
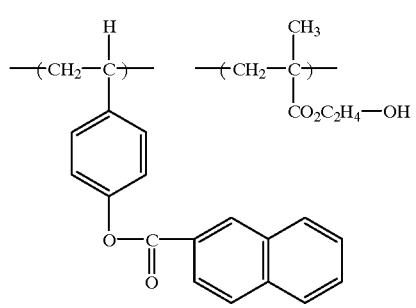
(21)
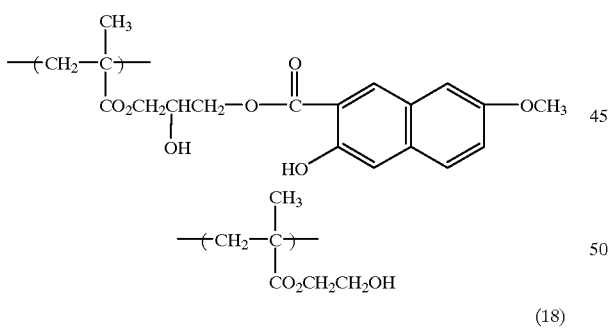
(18)
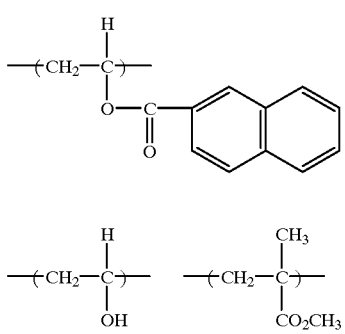
(22)
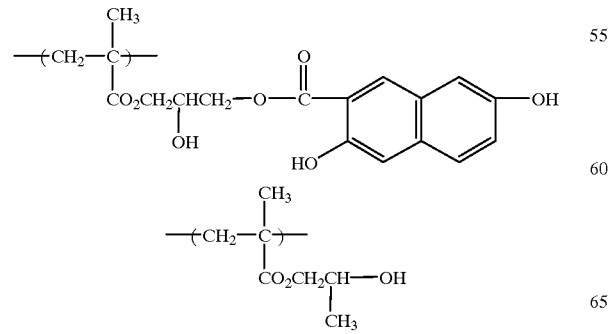
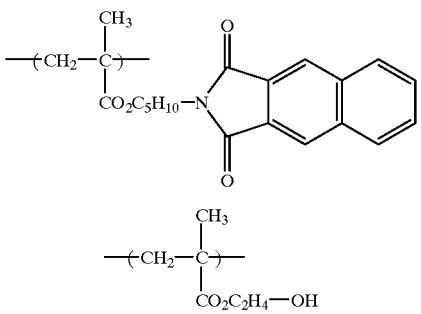

(25)
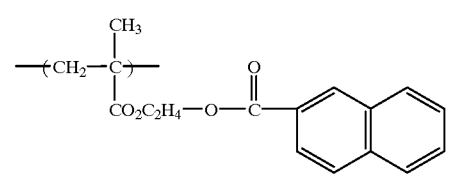
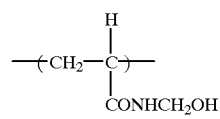
(26)
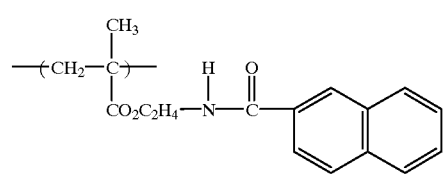
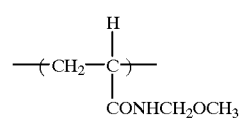
(27)
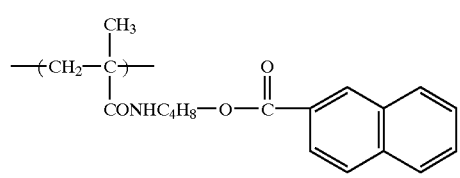
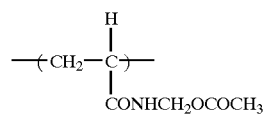
(28)
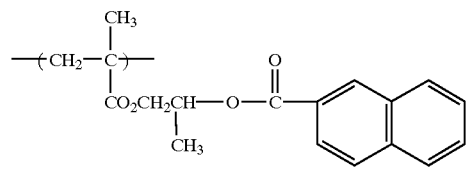
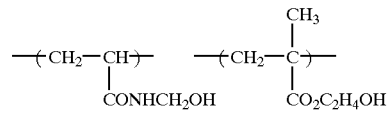
(29)
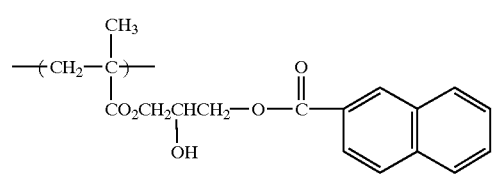
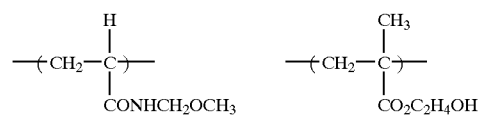
(30)
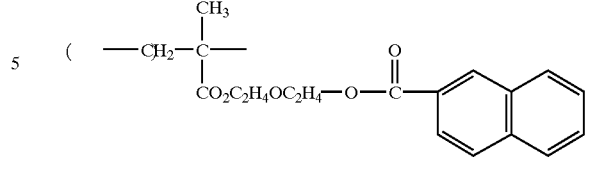
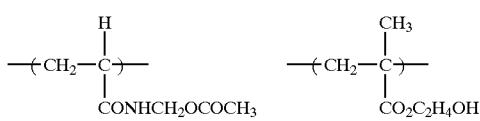
(31)
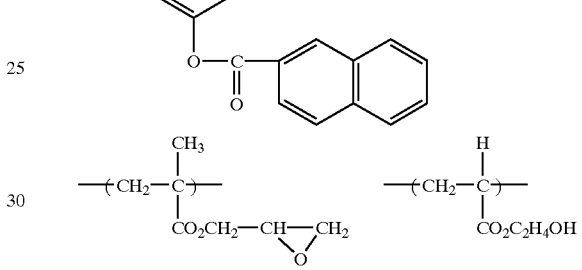
(32)
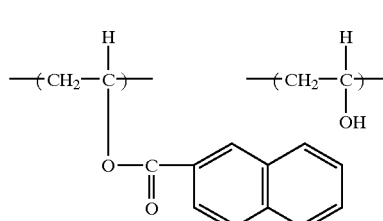
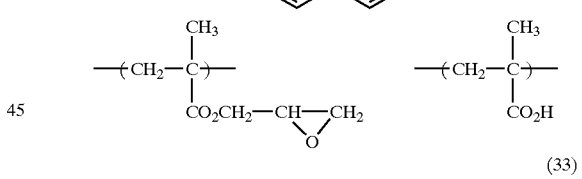
(33)
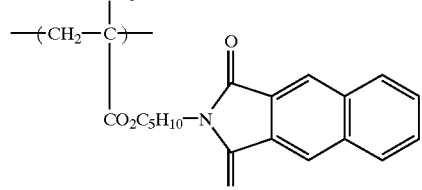
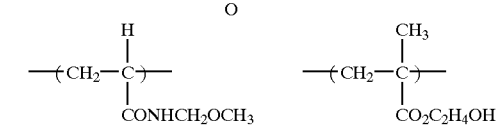
Polymer (a) for use in the composition according to the present invention can be synthesized by radical polymerization, anion polymerization or cation polymerization. Various methods, for example, a solution polymerization method, a suspension polymerization method, an emulsion polymerization method and a bulk polymerization method can be employed.

The molecular weight of polymer (a) may be varied depending on various factors, for example, a coating solvent used, a solution viscosity required and a coating shape required. However, the weight average molecular weight thereof measured by gel permeation chromatography and calculated in terms of polystyrene is ordinarily from 1,000 to 1,000,000, preferably from 2,000 to 300,000, and more preferably from 3,000 to 200,000.

The content of polymer (a) in the bottom anti-reflective coating material composition according to the invention is preferably from 50 to 90% by weight, more preferably from 70 to 90% by weight, based on the total solid contents.

Now, the thermal crosslinking agent of component (b) will be described in more detail below.

Component (b) in the composition is a thermal crosslinking agent (hereinafter also referred to as thermal crosslinking agent (b) sometimes) which is activated by an acid to react with component (a) described above, thereby forming a crosslinked structure. Preferred examples of the thermal crosslinking agent include a melamine, benzoguanamine, glycoluril or urea compound substituted with at least one substituent selected from a methylol group, an alkoxymethyl group and an acyloxymethyl group.

Specific examples of the alkoxymethyl group includes methoxymethyl, ethoxymethyl, propoxymethyl and butoxymethyl.

Specific examples of the acyloxymethyl group includes acetyloxymethyl.

The number of methylol, alkoxymethyl and acyloxymethyl groups contained in the compound is varied depending on the compound having these substituents, but, it is from 2 to 6, preferably from 5 to 6, per molecule in case of the melamine compound, from 2 to 4, preferably from 3 to 4, per molecule in case of the glycoluril compound and benzoguanamine compound, and from 3 to 4 per molecule in case of the urea compound.

On these compounds, hexamethoxymethylmelamine, tetramethoxymethylbenzoguanamine and tetramethoxymethylglycoluril are particularly preferred in view of a thermal crosslinking property and storage stability.

The methylol group-containing compound can be obtained by reacting melamine, benzoguanamine, glycoluril or urea with formalin in the presence of a basic catalyst, for example, sodium hydroxide, potassium hydroxide, ammonia or a tetraalkylammonium hydroxide.

The alkoxymethyl group-containing compound can be obtained by heating the methylol group-containing compound in an alcohol in the presence of an acid catalyst, for example, hydrochloric acid, sulfuric acid, nitric acid or methanesulfonic acid.

The acyloxymethyl group-containing compound can be obtained by reacting the methylol group-containing compound with an acid anhydride or acid halide in the presence of a basic catalyst.

The content of thermal crosslinking agent (b) in the bottom anti-reflective coating material composition according to the invention is ordinarily from 2 to 50% by weight, preferably from 5 to 30% by weight, based on the total solid contents.

Now, the sulfonic acid ester compound or diaryl iodonium salt (hereinafter also referred to as thermally acid-generating agent (c) sometimes) of component (c) will be described in more detail below.

Component (c) is a compound which is decomposed with heating to generate an acid that accelerates the thermal crosslinking reaction between polymer (a) and thermal crosslinking agent (b).

The inventors have been investigated various thermally acid-generating agents and as a result, it has been found that a compound which is decomposed to generate an acid at temperature between 150 to 200° C. is suitable for use in the bottom anti-reflective coating material composition for a photoresist. Thermally acid-generating agents having the decomposition temperature of lower than 150° C. are disadvantageous in view of storage stability. Specifically, these compounds cause the crosslinking reaction to increase the molecular weight thereof during storage of the composition and thus, a coating ability of the composition is deteriorated. On the other hand, thermally acid-generating agents having the decomposition temperature of higher than 200° C. are also not suitable, since they need high temperature for the crosslinking, which is inefficient, and unevenness of crosslinking tends to occur in the resulting coating.

The temperature at which the thermally acid-generating agent used as component (c) initiates to generate an acid with heating is from 150 to 200° C., preferably from 170 to 190° C.

Of the thermally acid-generating agents of component (c), the sulfonic acid ester compound is preferably an organic sulfonic acid ester having from 3 to 20 carbon atoms, and specifically includes a sulfonic acid ester of a secondary alcohol such as 2-propanol or 1-methoxy-2-propanol.

The diaryl iodonium salt includes a salt of a diaryl iodonium cation with an organic sulfonic acid anion, $SbF_6$ anion, $PF_6$ anion or $AsF_6$ anion. The organic sulfonic acid anion is preferred as the anion.

Specific examples of the diaryl iodonium salt are set forth below, but the present invention should not be construed as being limited thereto.

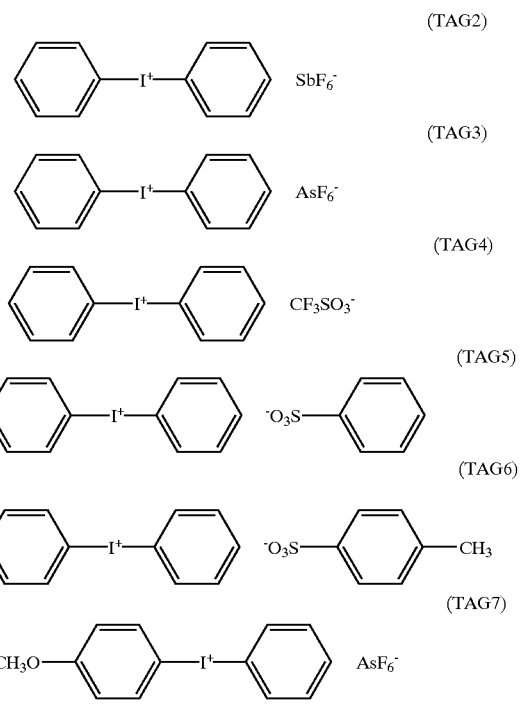

-continued (TAG8) [structure: 4-methoxyphenyl phenyl iodonium triflate] CF₃SO₃⁻

(TAG9) [structure: 4-methoxyphenyl phenyl iodonium 2,4,6-trimethylbenzenesulfonate]

(TAG10) [structure: bis(4-methylphenyl) iodonium triflate] CF₃SO₃⁻

(TAG11) [structure: bis(4-methylphenyl) iodonium benzenesulfonate]

(TAG12) [structure: bis(4-methylphenyl) iodonium 4-methylbenzenesulfonate]

(TAG13) [structure: bis(4-tert-butylphenyl) iodonium 4-methylbenzenesulfonate]

(TAG14) [structure: bis(4-tert-butylphenyl) iodonium 2,4,6-triisopropylbenzenesulfonate]

(TAG15) [structure: bis(4-tert-butylphenyl) iodonium ...]

(TAG-continued, column 20)

[structure: 2,4,6-trimethylbenzenesulfonate anion]

(TAG16) [structure: bis(4-tert-amylphenyl) iodonium triflate] CF₃SO₃⁻

(TAG17) [structure: bis(4-tert-amylphenyl) iodonium 2,4,6-trimethylbenzenesulfonate]

(TAG18) [structure: bis(4-tert-amylphenyl) iodonium 2,4,6-triisopropylbenzenesulfonate]

(TAG19) [structure: bis(4-n-heptylphenyl) iodonium triflate] CF₃SO₃⁻

(TAG20) [structure: bis(4-n-heptylphenyl) iodonium benzenesulfonate]

(TAG21) [structure: bis(4-n-heptylphenyl) iodonium 4-methylbenzenesulfonate]

(TAG22) [structure: bis(4-chlorophenyl) iodonium hexafluoroarsenate] AsF₆⁻

-continued (TAG23)
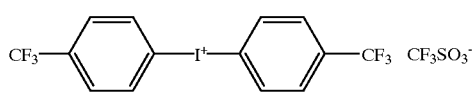

(TAG24)
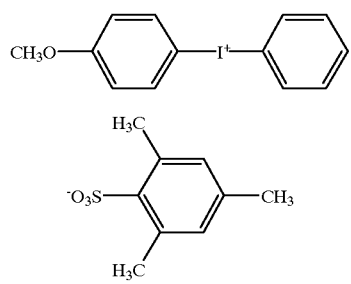

(TAG25)

(TAG26)

(TAG27)
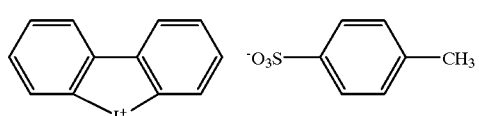

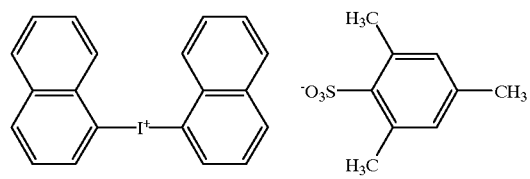

(TAG28)
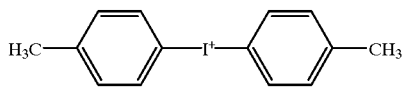

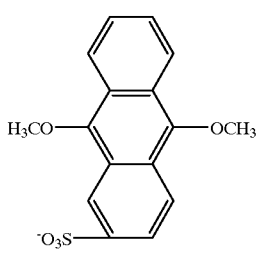

(TAG29)
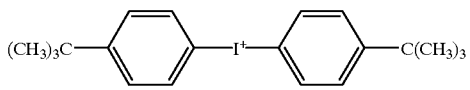

-continued

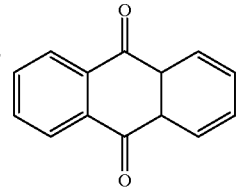

Of these compounds, a salt of a diaryl iodonium cation with an organic sulfonic acid anion is preferred in view of stability and solubility to a solvent.

Further, a salt of a diaryl iodonium cation having a straight chain or branched alkyl group having from 1 to 12 carbon atoms or an alkoxy group having from 1 to 12 carbon atoms as a substituent on the aryl group thereof with an organic sulfonic acid anion is preferred also in view of safety. Specific examples of the straight chain or branched alkyl group having from 1 to 12 carbon atoms or alkoxy group having from 1 to 12 carbon atoms include a methyl group, an ethyl group, an n-propyl group, an isopropyl group, an n-butyl group, a sec-butyl group, an isobutyl group, a tert-butyl group, an n-amyl group, an isoamyl group, a tert-amyl group, an n-hexyl group, an n-heptyl group, an n-octyl group, a 2-ethylhexyl group, an n-decyl group, an n-dodecyl group, a cyclopropyl group, a cyclopentyl group, a cyclohexyl group, a methoxy group, an ethoxy group, a propoxy group and a butoxy group. Specific examples of the aryl group in diaryl iodonium include a phenyl group, a naphthyl group, an anthryl group and a phenanthryl group.

Of the organic sulfonic acid anions, trifluoromethanesulfonato, methanesulfonato and an arylsulfonato which may have a straight chain or branched alkyl group having from 1 to 12 carbon atoms (including specifically those described above), an alkoxy group having from 1 to 12 carbon atoms(including specifically those described above) or a halogen atom, as a substituent on the aryl group thereof are preferred in view of solubility to a solvent. The aryl group of the arylsulfonato specifically includes those described above.

Thermally acid-generating agents (c) can be employed individually or in a combination of two or more thereof.

Thermally acid-generating agent (c) is employed, in terms of a solid basis, ordinarily from 0.5 to 10 parts by weight, preferably from 1 to 5 parts by weight, based on 100 parts by weight of the bottom anti-reflective coating material composition according to the invention.

In the composition of the present invention, a polymer having both the function of polymer (a) as described above and the function of thermally acid-generating agent (c) as described above is preferably used.

Such a polymer includes a polymer (hereinafter also referred to as polymer (a') sometimes) containing a repeating unit including a dye structure having a molar extinction coefficient of $1.0 \times 10^4$ or more to light including a wavelength used for exposure of the photoresist and a repeating unit including a sulfonic acid ester structure or diaryl iodonium structure, which is decomposed to generate an acid with heating at temperature between 150 to 200° C.

Polymer (a') is a polymer having the structure capable of generating an acid with heating connected to a polymer chain of the light-absorbing polymer.

The structure capable of generating an acid with heating is preferably bonded to a repeating unit constituting polymer

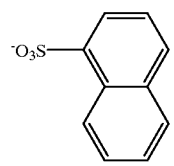

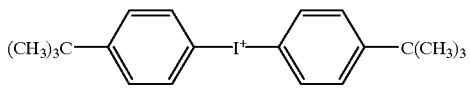

(a'). Such a repeating unit includes a repeating unit constituting the above described polymer and containing the above described dye structure.

The sulfonic acid ester structure or diaryl iodonium structure suitable for polymer (a') includes those of thermally acid-generating agents (c) described above and the sulfonic acid ester structure or diaryl iodonium structure is connected to the repeating unit in any position thereof.

Specific examples of the repeating unit having the sulfonic acid ester structure or diaryl iodonium structure are set forth below.

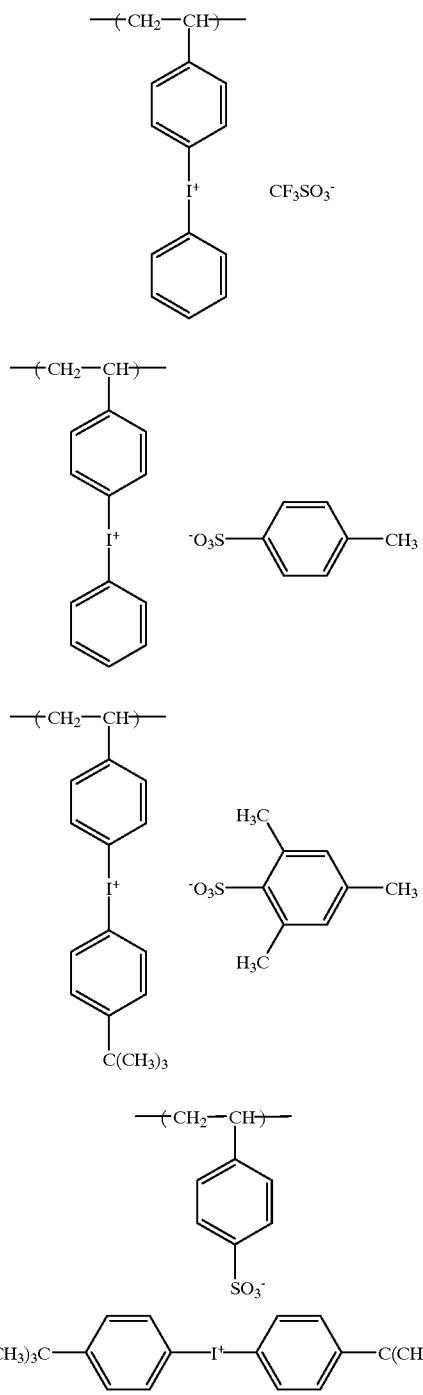

(PTAG1)
(PTAG2)
(PTAG3)
(PTAG4)

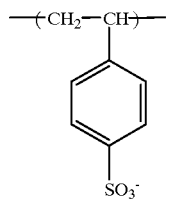

(PTAG5)

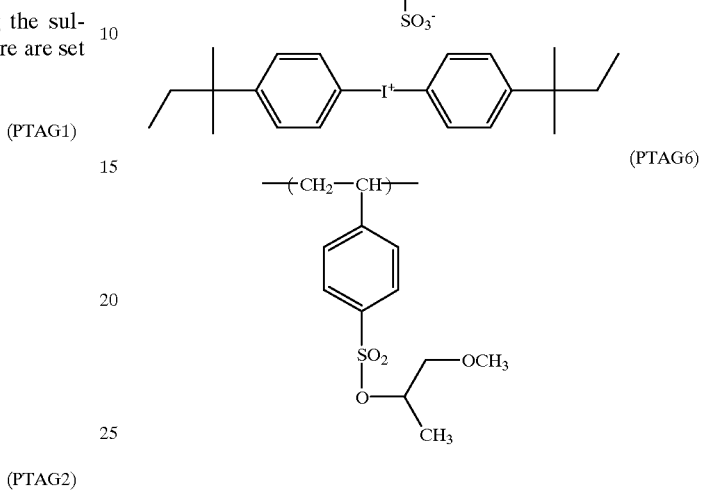

(PTAG6)

With respect to the repeating unit including a dye structure, other copolymerizing components, a content of each repeating unit, glass transition temperature, weight average molecular weight and other physical properties of the polymer (a'), the descriptions on those for polymer (a) above are fully applied.

Synthesis of polymer (a') can be conducted by addition polymerization such as radical polymerization, cation polymerization or anion polymerization or condensation polymerization of a monomer including a dye structure and a monomer including a thermally acid-generating structure.

The content of the repeating unit including the sulfonic acid ester structure or diaryl iodonium structure in polymer (a') is ordinarily from 1 to 10% by weight, preferably from 2 to 5% by weight, based on the whole repeating units.

Further, polymer (a') may contain a non-light-absorbing monomer and a thermal crosslinking monomer as copolymer components for the same reason as described in the case of polymer (a).

In case of using polymer (a'), thermal crosslinking agent (b) is also employed in an amount same as that described for polymer (a). On the other hand, thermally acid-generating agent (c) is not always necessarily used. However, in some cases, it is preferred to additionally use thermally acid-generating agent (c) for obtaining good results depending on the amount of the thermally acid-generating structure contained in polymer (a').

The bottom anti-reflective coating material composition for a photoresist according to the present invention may contain an additional light absorbent, an adhesion aid or a surface active agent, if desired.

Suitable examples of the light absorbent include anthracene and a derivative thereof, β-carbonylnaphtalene and a derivative thereof, benzophenone and a derivative thereof, phenanthrene and a derivative thereof, quinoline and a derivative thereof, acridine and a derivative thereof, and thioxanthone and a derivative thereof.

Specific examples thereof include anthracene, 9-hydroxymethylanthracene, 9-carboxyanthracene, 2-naphthoic acid, 1-hydroxy-2-naphthoic acid, 3-hydroxy-2-naphthoic acid, 7-methoxy-3-hydroxy-2-naphthoic acid, benzophenone, 2,4-dihydroxybenzophenone, 4,4'-dihydroxybenzophenone, 2,3,4-trihydroxybenzophenone, phenanthrene, hydroxy-phenanthrene, quinoline, N-phenylacridine, thioxanthone and diethylthioxanthone.

The light absorbent is ordinarily employed in a proportion of 30 parts by weight or less, preferably 20 parts by weight or less, per 100 parts by weight of the bottom anti-reflective coating material composition.

The adhesion aid is added mainly for the purpose of improving the adhesion between the bottom anti-reflective coating composition and a substrate or a resist, particularly for preventing from peeling of the resist in an etching process. Specific examples of the adhesion aid include chlorosilanes such as trimethylchlorosilane, dimethylvinylchlorosilane, methyldiphenylchlorosilane and chloromethyldimethylchlorosilnae, alkoxysilanes such as trimethylmethoxysilane, dimethyldiethoxysilane, methyldimethoxysilane, dimethylvinylethoxysilane, diphenyldimethoxysilane and phenyltriethoxysilane, silazanes such as hexamethyldisilazane, N,N'-bis(trimethylsilyl)urea, dimethyltrimethylsilylamine and trimethylsilylimidazole, silanes such as vinyltrichlorosilane, γ-chloropropyltrimethoxysilane, γ-aminopropyltriethoxysilane and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazolthiouracil, mercaptoimidazole and mercaptopyrimidine, and ureas and thiourea compounds such as 1,1-dimethylurea and 1,3-dimethylurea.

The adhesion aid is ordinarily employed in a proportion of less than 10 parts by weight, preferably less than 5 parts by weight, per 100 parts by weight of the bottom anti-reflective coating material composition.

The bottom anti-reflective coating material composition of the present invention may contain a surface active agent so as to further improve the coating ability such as to prevent striation.

Suitable examples of the surface active agent include nonionic surface active agents such as polyoxyethylene alkyl ethers (e.g., polyoxyethylene lauryl ether, polyoxyethylene stearyl ether, polyoxyethylene cetyl ether, and polyoxyethylene oleyl ether), polyoxyethylene alkylaryl ethers (e.g., polyoxyethylene octylphenyl ether, and polyoxyethylene nonylphenyl ether), polyoxyethylenepolyoxypropylene block copolymers, sorbitan fatty acid esters (e.g., sorbitan monolaurate, sorbitan monopalmitate, sorbitan monostearate, sorbitan monooleate, sorbitan trioleate, and sorbitan tristearate), and polyoxyethylenesorbitan fatty acid esters (e.g., polyoxyethylene-sorbitan monolaurate, polyoxyethylenesorbitan monopalmitate, polyoxyethylenesorbitan monostearate, polyoxyethylene-sorbitan trioleate, and polyoxyethylenesorbitan tristearate), fluorine-base surface active agents such as Eftop EF301, EF303 and EF352 (all produced by Shin Akita Kasei KK), Megafac F171 and F173 (both produced by Dainippon Ink and Chemicals, Inc.), Florad FC430 and FC431 (both produced by Sumitomo 3M KK), Asahiguard AG710, and Surflon S-382, SC101, SC102, SC103, SC104, SC105 and SC106 (all produced by Asahi Glass Co., Ltd.), Organosiloxane Polymer KP341 (produced by Shin-Etsu Chemical Co., Ltd.), and an acrylic acid-base or methacrylic acid-base (co)polymer such as Polyflow No. 75 and 95 (both produced by Kyoeisha Chemical Co., Ltd.). Among these surface active agents, a fluorine-base surface active agent and a silicon-base surface active agent are preferred. The surface active agent is ordinarily employed in a proportion of 2 parts by weight or less, preferably 1 part by weight or less, per 100 parts by weight of the solid content in the composition of the present invention.

The surface active agents can be employed individually or in a combination of two or more thereof.

Now, the organic solvent (hereinafter also referred to as solvent (d) sometimes) of component (d) of the bottom anti-reflective coating material composition according to the present invention will be described in more detail below.

Suitable examples of solvent (d) include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methylether acetate, propylene glycol propylether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate and butyl acetate. The organic solvents can be used individually or in a combination of two or more thereof.

Further, a high boiling point solvent such as N-methylformamide, N,N-dimethylformamide, N-methylacetamide, N,N-dimethylacetamide, N-methylpyrrolidone, dimethyl sulfoxide and benzyl ethyl ether may be used in combination.

Among these solvents, propylene glycol methyl ether acetate and ethyl 3-ethoxypropionate are preferred in view of safety.

A resist coated on the bottom anti-reflective coating material composition according to the present invention may be either negative or positive. A chemical amplification type resist comprising a photo-acid generator and a binder having a group capable of being decomposed by an acid to increase an alkali dissolution rate, a chemical amplification type resist comprising an alkali soluble binder, a photo-acid generator and a low molecular weight compound capable of being decomposed by an acid to increase an alkali dissolution rate of the resist, or a chemical amplification type resist comprising a photo-acid generator, a binder having a group capable of being decomposed by an acid to increase an alkali dissolution rate and a low molecular weight compound capable of being decomposed by an acid to increase an alkali dissolution rate of the resist can be suitably used. Specific examples thereof include FKR-321BC and ARCH-2 both manufactured by Fuji Film Olin Co., Ltd.

Examples of a developer suitable for a photoresist in case of using the bottom anti-reflective coating material composition for a photoresist of the present invention, include an aqueous solution of an alkali, for example, an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethylammonium hydroxide, tetraethylammonium hydroxide and choline, and a cyclic amine such as pyrrole and piperazine. Further, an alcohol such as isopropyl alcohol or a surface active agent such as a nonionic surface active agent may be added to use to the aqueous solution of alkali in an appropriate amount.

Among the above-described a developers, a quaternary ammonium salt is preferred, and tetramethylammonium hydroxide and chlorine are more preferred.

The bottom anti-reflective coating material composition of the present invention is coated on a substrate (for example, a transparent substrate such as a silicon/silicon dioxide coating, a glass substrate and an ITO substrate) as used in the production of a precision integrated circuit element by an appropriate coating method using a device such as a spinner or a coater. Then, the coating was baked to cure the bottom anti-reflective coating material composition, thereby forming a bottom anti-reflective coating. The bottom anti-reflective coating preferably has a thickness of form 0.01 to 3.0 $\mu$m. the baking after the coating is preferably performed at a temperature of from 80 to 250° C. for from 1 to 120 minutes. On the thus-obtained anti-reflective coating, a photoresist composition is coated, then exposed through a predetermined mask to light, for example, KrF excimer laser light having a wavelength of 248 nm, developed, rinsed and dried to obtain a good resist pattern. After the exposure, heating (post exposure bake: PEB) is performed, if desired.

According to the bottom anti-reflective coating material composition for a photoresist and the method of forming a resist pattern using the same of the present invention, a bottom anti-reflective coating having a large absorbance to light including a wavelength used for exposure is formed, an adverse effect due to a standing wave generated by reflection from a substrate can be reduced, a limiting resolution of the photoresist is increased, and a good resist profile is obtained.

The present invention will be described in greater detail with reference to the following examples, but the present invention should not be construed as being limited thereto.

A molar extinction coefficient of the dye structure linking to a polymer was measured in the following manner.

Specifically, a low molecular weight compound having the dye structure substantially exhibiting a light-absorbing property was dissolved in a solvent capable of dissolving the low molecular weight compound, an absorption spectrum of the solution was measured by means of an ultraviolet-visible spectrophotometer, and a molar extinction coefficient was obtained according to Beer's low.

SYNTHETIC EXAMPLE 1

Synthesis of Polymer (11)
Synthesis of Monomer 130 g of 2-hydroxyethyl methacrylate and 190.5 g of 2-chloronaphthoyl were added to 600 ml of acetone and thereto was added dropwise 101 g of triethylamine. The mixture was reacted at 40° C. for 4 hours, 2 liters of distilled water was added thereto, and the product precipitated was collected by decantation. The product was purified by silica gel column chromatography. Yield: 75%.
Synthesis of Polymer 10 g of the monomer prepared above and 31 g of 2-hydroxyethyl methacrylate were dissolved in 60 g of dimethylformamide (DMF), the reaction solution was then heated at 65° C. and at the same time, nitrogen gas was blown into the reaction solution for 30 minutes. 50 mg of V-65 (manufactured by Wako Pure Chemical Industries, Ltd.) as a polymerization initiator was added thereto three times every two hours. The reaction product was reprecipitated in one liter of distilled water to recover Polymer (11) as powder. The polymer obtained was subjected to GPC analysis and it was found to have a weight average molecular weight, in terms of standard polystyrene, of 34,000.

A glass transition temperature of the polymer was measured by means of differential scanning calorimetry using an apparatus (DSC220C manufactured by Seiko Instruments Inc.) and it was 108° C. The dye structure included in Polymer (11) exhibited a molar extinction coefficient of $6.1 \times 10^4$ to light having a wavelength of 248 nm.

SYNTHETIC EXAMPLE 2

Synthesis of Polymer (14)
Synthesis of Monomer 144 g of 2-hydroxypropyl methacrylate and 190.5 g of 2-chloronaphthoyl were added to 600 ml of acetone and thereto was added dropwise 101 g of triethylamine. The mixture was reacted at 40° C. for 4 hours, 2 liters of distilled water was added thereto, and the product precipitated was collected by decantation. The product was purified by silica gel column chromatography. Yield: 80%.
Synthesis of Polymer 12 g of the monomer prepared above and 3 g of 2-hydroxypropyl methacrylate were dissolved in 60 g of DMF, the reaction solution was then heated at 65° C. and at the same time, nitrogen gas was blown into the reaction solution for 30 minutes. 50 mg of V-65 (manufactured by Wako Pure Chemical Industries, Ltd.) as a polymerization initiator was added thereto three times every two hours. The reaction product was reprecipitated in one liter of distilled water to recover Polymer (14) as powder. The polymer obtained was subjected to GPC analysis and it was found to have a weight average molecular weight, in terms of standard polystyrene, of 22,000.

A glass transition temperature of the polymer was measured by means of differential scanning calorimetry using an apparatus (DSC220C manufactured by Seiko Instruments Inc.) and it was 128° C. The dye structure included in Polymer (14) exhibited a molar extinction coefficient of $6.1 \times 10^4$ to light having a wavelength of 248 nm.

SYNTHETIC EXAMPLE 3

Synthesis of Polymer (15)
Synthesis of Monomer 142 g of glycidyl methacrylate, 172 g of 2-naphthoic acid and 0.5 g of methoxyhydroquinone were added to 600 ml of acetone and thereto was added dropwise 101 g of triethylamine. The mixture was reacted at 70° C. for 4 hours, 2 liters of distilled water was added thereto, and the product precipitated was collected by decantation. The product was purified by silica gel column chromatography. Yield: 80%.
Synthesis of Polymer 12 g of the monomer prepared above and 3 g of 2-hydroxyethyl methacrylate were dissolved in 60 g of DMF, the reaction solution was then heated at 65° C. and at the same time, nitrogen gas was blown into the reaction solution for 30 minutes. 50 mg of V-65 (manufactured by Wako Pure Chemical Industries, Ltd.) as a polymerization initiator was added thereto three times every two hours. The reaction product was reprecipitated in one liter of distilled water to recover Polymer (15) as powder. The polymer obtained was subjected to GPC analysis and it was found to have a weight average molecular weight, in terms of standard polystyrene, of 19,000.

A glass transition temperature of the polymer was measured by means of differential scanning calorimetry using an apparatus (DSC220C manufactured by Seiko Instruments Inc.) and it was 138° C. The dye structure included in Polymer (15) exhibited a molar extinction coefficient of $6.3 \times 10^4$ to light having a wavelength of 248 nm.

SYNTHESIS EXAMPLE 4

Synthesis of Polymer (16)

Synthesis of Monomer 128 g of glycidyl methacrylate, 188 g of 3-hydroxy-2-naphtoic acid and 0.5 g of methoxyhydroquinone were added to 600 ml of acetone and thereto was added dropwise 101 g of triethylamine. The mixture was reacted at 70° C. for 4 hours, 2 liters of distilled water was added thereto, and the product precipitated was collected by decantation. The product was purified by silica gel column chromatography. Yield: 80%.

Synthesis of Polymer 12 g of the monomer prepared above and 3 g of 2-hydroxyethyl acrylate were dissolved in 60 g of DMF, the reaction solution was heated at 650C and at the same time, nitrogen gas was blown into the reaction solution for 30 minutes. 50 mg of V-65 (manufactured by Wako Pure Chemical Industries, Ltd.) as a polymerization initiator was added thereto three times every two hours. The reaction product was reprecipitated in one liter of distilled water to recover Polymer (16) as powder. The polymer obtained was subjected to GPC analysis and it was found to have a weight average molecular weight, in terms of standard polystyrene, of 19,000.

A glass transition temperature of the polymer was measured by means of differential scanning calorimetry using an apparatus (DSC220C manufactured by Seiko Instruments Inc.) and it was 128° C. The dye structure included in Polymer (16) exhibited a molar extinction coefficient of $7.9 \times 10^4$ to light having a wavelength of 248 nm.

SYNTHESIS EXAMPLE 5

Synthesis of Polymer (17)

Synthesis of Monomer 142 g of glycidyl methacrylate, 218 g of 3-hydroxy-7-methoxy-2-naphtoic acid and 0.5 g of methoxyhydroquinone were added to 600 ml of acetone and thereto was added dropwise 101 g of triethylamine. The mixture was reacted at 70° C. for 4 hours, 2 liters of distilled water was added thereto, and the product precipitated was collected by decantation. The product was purified by silica gel column chromatography. Yield: 85%.

Synthesis of Polymer 12 g of the monomer prepared above and 3 g of 2-hydroxyethyl methacrylate were dissolved in 60 g of DMF, the reaction solution was heated at 65° C. and at the same time, nitrogen gas was blown into the reaction solution for 30 minutes. 50 mg of V-65 (manufactured by Wako Pure Chemical Industries, Ltd.) as a polymerization initiator was added thereto three times every two hours. The reaction product was reprecipitated in one liter of distilled water to recover Polymer (17) as powder. The polymer obtained was subjected to GPC analysis and it was found to have a weight average molecular weight, in terms of standard polystyrene, of 31,000.

A glass transition temperature of the polymer was measured by means of differential scanning calorimetry using an apparatus (DSC220C manufactured by Seiko Instruments Inc.) and it was 105° C. The dye structure included in Polymer (17) exhibited a molar extinction coefficient of $8.5 \times 10^4$ to light having a wavelength of 248 nm.

SYNTHESIS EXAMPLE 6

Synthesis of Polymer (18)

Synthesis of Monomer 142 g of glycidyl methacrylate, 204 g of 3,7-dihydroxy-2-naphtoic acid and 0.5 g of methoxyhydroquinone were added to 600 ml of acetone and thereto was added dropwise 101 g of triethylamine. The mixture was reacted at 70° C. for 4 hours, 2 liters of distilled water was added thereto, and the product precipitated was collected by decantation. The product was purified by silica gel column chromatography. Yield: 62%.

Synthesis of Polymer 12 g of the monomer prepared above and 3 g of 2-hydroxypropyl methacrylate were dissolved in 60 g of DMF, the reaction solution was heated at 65° C. and at the same time, nitrogen gas was blown into the reaction solution for 30 minutes. 50 mg of V-65 (manufactured by Wako Pure Chemical Industries, Ltd.) as a polymerization initiator was added thereto three times every two hours. The reaction product was reprecipitated in one liter of distilled water to recover Polymer (18) as powder. The polymer obtained was subjected to GPC analysis and it was found to have a weight average molecular weight, in terms of standard polystyrene, of 27,000.

A glass transition temperature of the polymer was measured by means of differential scanning calorimetry using an apparatus (DSC220C manufactured by Seiko Instruments Inc.) and it was 110° C. The dye structure included in Polymer (18) exhibited a molar extinction coefficient of $8.9 \times 10^4$ to light having a wavelength of 248 nm.

SYNTHESIS EXAMPLE 7

Synthesis of Comparative Polymer (1)

Synthesis of Monomer 160 g of triethylene glycol acrylate and 190.5 g of 2-chloronaphtholy were added to 600 ml of acetone and thereto was added dropwise 101 g of triethylamine. The mixture was reacted at 40° C. for 4 hours, 2 liters of distilled water was added thereto, and the product precipitated was collected by decantation. The product was purified by silica gel column chromatography. Yield: 80%.

Synthesis of Polymer 12 g of the monomer prepared above and 3 g of 2-hydroxyethyl acrylate were dissolved in 60 g of DMF, the reaction solution was heated at 65° C. and at the same time, nitrogen gas was blown into the reaction solution for 30 minutes. 150 mg of. V-65 (manufactured by Wako Pure Chemical Industries, Ltd.) as a polymerization initiator was added thereto three times every two hours. The reaction product was reprecipitated in one liter of distilled water to recover Comparative Polymer (1) as powder. The polymer obtained was subjected to GPC analysis and it was found to have a weight average molecular weight, in terms of standard polystyrene, of 28,000.

A glass transition temperature of the polymer was measured by means of differential scanning calorimetry using an apparatus (DSC220C manufactured by Seiko Instruments Inc.) and it was 62° C. The dye structure included in Comparative Polymer (1) exhibited a molar extinction coefficient of $6.1 \times 10^4$ to light having a wavelength of 248 nm.

Comparative Polymer (1) obtained had the following structure units:

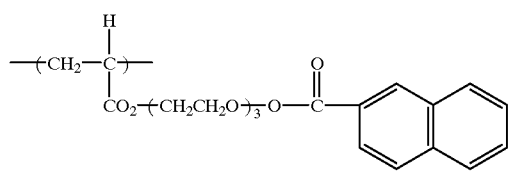

-continued

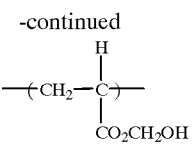

SYNTHESIS EXAMPLE 8
Synthesis of Comparative Polymer (2)
Synthesis of Monomer To 198 g of 2,3-naphthalenedicarboxylic acid anhydride were added 75g of 3-aminopropanol and 400 g of dioxane, and the mixture was reacted at 80° C. for 4 hours. 200 g of the resulting imide compound was dissolved in 500 g of DMF, and to the solution was added 74 g of methacryloyl chloride and then 72 g of triethylamine was added dropwise. The mixture was reacted at 40° C. for 4 hours, 2 liters of distilled water was added thereto, and the product deposited was collected by filtration. The product was recrystallized from a solvent mixture of DMF/water. Yield: 72%.
Synthesis of Polymer 12 g of the monomer prepared above and 4 g of glycidyl methacrylate were dissolved in 60 g of DMF, the reaction solution was heated at 65° C. and at the same time, nitrogen gas was blown into the reaction solution for 30 minutes. 50 mg of V-65 (manufactured by Wako Pure Chemical Industries, Ltd.) as a polymerization initiator was added thereto three times every two hours. The reaction product was reprecipitated in one liter of distilled water to recover Comparative Polymer (2) as powder. The polymer obtained was subjected to GPC analysis and it was found to have a weight average molecular weight, in terms of standard polystyrene, of 41,000.

A glass transition temperature of the polymer was measured by means of differential scanning calorimetry using an apparatus (DSC220C manufactured by Seiko Instruments Inc.) and it was 188° C. The dye structure included in Comparative Polymer (2) exhibited a molar extinction coefficient of $6.1 \times 10^4$ to light having a wavelength of 248 nm.

Comparative Polymer (1) obtained had the following structure units:

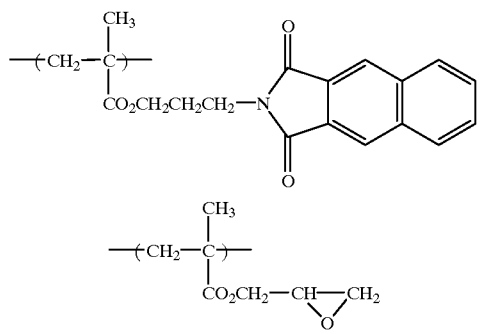

EXAMPLES 1 TO 8 AND COMPARATIVE EXAMPLES 1 TO 6

17 g of each polymer light absorbent obtained in Synthesis Examples described above, 2.5 g of hexamethoxymethylmelamine and 0.5 g of thermally acid-generating agent shown in Table 1 below were dissolved in propylene glycol methylether acetate to prepare a 10% solution, and the solution was filtered through a microfilter made of Teflon having a pore size of 0.10 µm to prepare a bottom anti-reflective coating solution. The solution was coated on a silicon wafer by means of a spinner and heated on a vacuum contact type hot plate at 205° C. for one minute to form a bottom anti-reflective coating having a thickness of 0.11 µm. The coating absorbance of the bottom anti-reflective coating to KrF excimer laser light having a wavelength of 248 nm was determined by providing the coating on a quartz wafer and measuring its absorbance by means of an ultraviolet-visible spectrophotometer.

In Comparative Examples 1 to 6, the thermally acid-generating agent other than the compound defined in the present invention, i.e., triphenylsulfonium tosylate (having a thermally decomposing temperature of 220° C.) or cyclohexyl tosylate (having a thermally decomposing temperature of 140° C.) was used as component (c). On each bottom anti-reflective coating obtained was coated a positive photoresist for KrF excimer laser (FKR-321BC manufactured by Fuji Film Olin Co., Ltd.) to prepare a photoresist layer having a thickness of 0.70 µm. The layer was exposed to KrF excimer laser light having a wavelength of 248 nm using a reduction projection exposure apparatus (NSR-2205EX12B manufactured by Nikon Corp.), subjected to post exposure baking at 110° C. for 60 seconds, and developed with a 2.38% aqueous solution of tetramethylammonium hydroxide for 60 seconds to prepare a resist pattern.

The thus-obtained resist pattern on the silicon wafer was observed by means of a scanning electron microscope and evaluated with limiting resolution, film thickness dependency and resist profile, specifically, the occurrence of footing or undercut resulting from intermixing.

The limiting resolution means limiting resolution at an exposure amount necessary for reproducing a mask patter of 0.50 µm when the film thickness is 0.70 µm.

The film thickness dependency was evaluated using a ratio of the limiting resolution with a resist film thickness of 0.70 µm to the limiting resolution with a resist film thickness of 0.73 µm. A value closer to 1.0 is preferred.

The results obtained are shown in Table 2 below.

TABLE 1

Compounds used in Examples and Comparative Examples

| Example or Comparative Example | Polymer Light Absorbent (a) | Thermal Crosslinking Agent (b) | Thermally Acid-Generating Agent (c) |
|---|---|---|---|
| Example 1 | Synthesis Example 1 | Hexamethoxymethylmelamine | TAG14 |
| Example 2 | Synthesis Example 2 | Hexamethoxymethylmelamine | TAG10 |
| Example 3 | Synthesis Example 3 | Hexamethoxymethylmelamine | TAG18 |
| Example 4 | Synthesis Example 4 | Hexamethoxymethylmelamine | TAG17 |
| Example 5 | Synthesis Example 5 | Hexamethoxymethylmelamine | TAG18 |
| Example 6 | Synthesis Example 6 | Hexamethoxymethylmelamine | TAG21 |
| Example 7 | Synthesis Example 7 | Hexamethoxymethylmelamine | TAG21 |
| Example 8 | Synthesis Example 8 | Hexamethoxymethylmelamine | TAG21 |
| Comparative Example 1 | Synthesis Example 1 | Hexamethoxymethylmelamine | Triphenylsulfonium tosylate |
| Comparative Example 2 | Synthesis Example 2 | Hexamethoxymethylmelamine | Triphenylsulfonium tosylate |

TABLE 1-continued

Compounds used in Examples and Comparative Examples

| Example or Comparative Example | Polymer Light Absorbent (a) | Thermal Crosslinking Agent (b) | Thermally Acid- Generating Agent (c) |
|---|---|---|---|
| Comparative Example 3 | Synthesis Example 3 | Hexamethoxymethylmelamine | Triphenyl- sulfonium tosylate |
| Comparative Example 4 | Synthesis Example 4 | Hexamethoxymethylmelamine | Cyclohexyl tosylate |
| Comparative Example 5 | Synthesis Example 5 | Hexamethoxymethylmelamine | Cyclohexyl tosylate |
| Comparative Example 6 | Synthesis Example 6 | Hexamethoxymethylmelamine | Cyclohexyl tosylate |

TABLE 2

| Example or Comparative Example | Coating Absorbance at 248 nm (/μm) | Limiting Resolution (μm) | Film Thickness Dependency | Resist Profile |
|---|---|---|---|---|
| Example 1 | 8.311 | 0.20 | 0.98 | Good (rectangular) |
| Example 2 | 8.373 | 0.20 | 0.98 | Good (rectangular) |
| Example 3 | 7.843 | 0.20 | 0.98 | Good (rectangular) |
| Example 4 | 7.668 | 0.20 | 0.98 | Good (rectangular) |
| Example 5 | 8.041 | 0.20 | 0.98 | Good (rectangular) |
| Example 6 | 8.618 | 0.20 | 0.98 | Good (rectangular) |
| Example 7 | 7.739 | 0.20 | 0.97 | Slight undercut |
| Example 8 | 7.993 | 0.20 | 0.97 | Slight footing |
| Comparative Example 1 | 7.637 | 0.23 | 0.97 | Footing |
| Comparative Example 2 | 7.711 | 0.22 | 0.97 | Footing |
| Comparative Example 3 | 7.316 | 0.21 | 0.97 | Footing |
| Comparative Example 4 | 7.816 | 0.21 | 0.97 | Undercut |
| Comparative Example 5 | 8.153 | 0.22 | 0.97 | Undercut |
| Comparative Example 6 | 8.127 | 0.21 | 0.97 | Undercut |

From the results shown in Table 2, it can be seen that the large coating absorbance, improved limiting resolution of a photoresist, excellent film thickness dependency of resolution due to a standing wave resulting from the decrease in reflection from a substrate, and good resist profile are obtained when the bottom anti-reflective coating was formed using the bottom anti-reflective coating material composition for a resist according to the present invention.

While the invention has been described in detail and with reference to specific embodiments thereof, it will be apparent to one skilled in the art that various changes and modifications can be made therein without departing from the spirit and scope thereof.

What is claimed is:

1. A bottom anti-reflective coating material composition for a photoresist comprising the following components (a) to (d):

(a) a polymer containing a dye structure having a molar extinction coefficient of $1.0 \times 10^4$ or more to light including a wavelength used for exposure of the photoresist;

(b) a thermal crosslinking agent which is activated by an acid to react with component (a) described above, thereby forming a crosslinked structure;

(c) a salt comprising a diaryl iodonium cation, having a straight chain or branched alkyl group or an alkoxyl group as a substituent on an aryl group thereof, and an organic sulfonic acid anion, which is decomposed to generate an acid with heating at temperature between 150 to 200° C.; and (d) an organic solvent capable of dissolving components (a) to (c) described above.

2. A bottom anti-reflective coating material composition for a photoresist as claimed in claim 1, wherein the polymer of component (a) has a glass transition temperature of from 80 to 180° C.

3. A bottom anti-reflective coating material composition for a photoresist as claimed in claim 1, wherein the polymer of component (a) contains a repeating unit having the dye structure in an amount of 10% by weight or more.

4. A bottom anti-reflective coating material composition for a photoresist as claimed in claim 1, wherein the dye structure in the polymer of component (a) is a structure represented by the following formula (I) or (II);

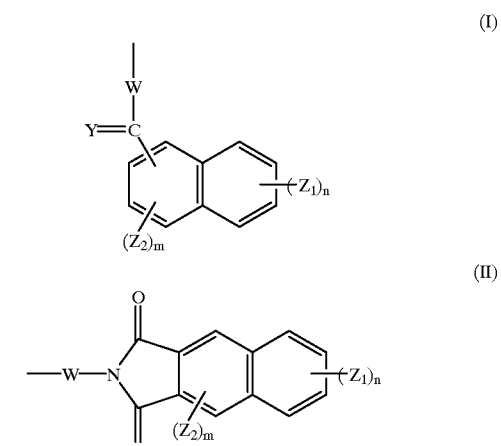

wherein W represents a linking group to the polymer main chain; Y represents an oxygen atom, a sulfur atom or $=$N—V; $Z_1$ and $Z_2$, which may be the same or different, each represents an electron donating group; m and n represent an integer of from 0 to 2 and from 0 to 3, respectively, and when m and n each is 2 or 3, the $Z_1$ groups or $Z_2$ groups may be the same or different; and V represents a hydroxy group, an amino group, a straight chain, branched or cyclic alkyl group having from 1 to 20 carbon atoms which may have a substituent, an aromatic or heteroaromatic ring group having from 5 to 14 carbon atoms which may have a substituent or an alkoxy group having from 1 to 20 carbon atoms.

5. A bottom anti-reflective coating material composition for a photoresist as claimed in claim 4, wherein Y in formula (I) is an oxygen atom.

6. A bottom anti-reflective coating material composition for a photoresist as claimed in claim 1, wherein the polymer of component (a) is a polymer containing a repeating unit represented by the following formula (IA) or (IIA):

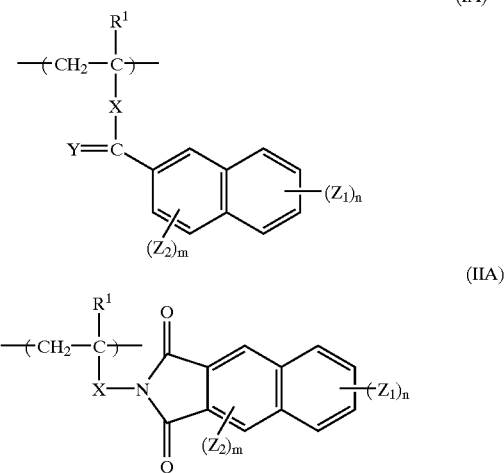

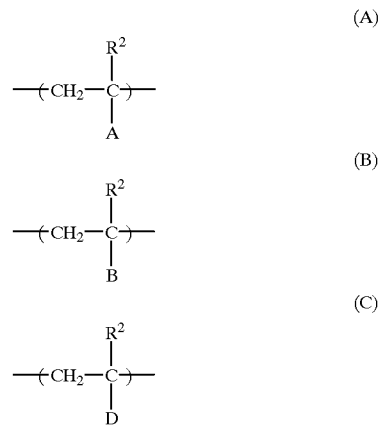

wherein $R^1$ represents a hydrogen atom, a methyl group, a chlorine atom, a bromine atom or a cyano group; X represents a divalent linking group; Y represents an oxygen atom, a sulfur atom or —N—V; $Z_1$ and $Z_2$, which may be the same or different, each represents an electron donating group; m and n represent an integer of from 0 to 2 and from 0 to 3, respectively, and when m and n each is 2 or 3, the $Z_1$ groups or $Z_2$ groups may be the same or different; and V represents a hydroxy group, an amino group, a straight chain, branched or cyclic alkyl group having from 1 to 20 carbon atoms which may have a substituent, an aromatic or heteroaromatic ring group having from 5 to 14 carbon atoms which may have a substituent or an alkoxy group having from 1 to 20 carbon atoms.

7. A bottom anti-reflective coating material composition for a photoresist as claimed in claim 6, wherein $Z_1$ and $Z_2$ in formula (IA) or (IIA), which may be the same or different, each represents a hydroxy group, —$OR_4$ (wherein $R_4$ represents a hydrocarbon group having from 1 to 20 carbon atoms), —$SR_4$ or —$NR_5R_6$ (wherein $R_5$ and $R_6$, which may be the same or different, each represents a hydrogen atom or a hydrocarbon group having from 1 to 20 carbon atoms).

8. A bottom anti-reflective coating material composition for a photoresist as claimed in claim 6, wherein the polymer of component (a) further contains a repeating unit of a non-light-absorbing monomer.

9. A bottom anti-reflective coating material composition for a photoresist as claimed in claim 8, wherein the non-light-absorbing monomer is selected from an acrylic ester, a methacrylic ester, an acrylamide, a methacrylamide, an allyl compound, a vinyl ether, a vinyl ester, a styrene and a crotonic ester.

10. A bottom anti-reflective coating material composition for a photoresist as claimed in claim 8, wherein the non-light-absorbing monomer is a monomer having a hydroxy group.

11. A bottom anti-reflective coating material composition for a photoresist as claimed in claim 8, wherein the non-light-absorbing monomer is an alkyl (meth)acrylate monomer containing the alkyl group having from 1 to 10 carbon atoms.

12. A bottom anti-reflective coating material composition for a photoresist as claimed in claim 5, wherein the polymer of component (a) further contains a repeating unit having a crosslinking group.

13. A bottom anti-reflective coating material composition for a photoresist as claimed in claim 12, wherein the repeating unit having a crosslinking group is represented by the following formula (A), (B) or (C):

wherein $R^2$ represents a hydrogen atom, a methyl group, a chlorine atom, a bromine atom or a cyano group; A represents a functional group having a —$CH_2OH$, —$CH_2OR^{14}$ or —$CH_2OCOCH_3$ terminal group (wherein $R^{14}$ represents a hydrocarbon group having from 1 to 20 carbon atoms); B represents a functional group having a —$CO_2H$ terminal group; and D represents a functional group having an epoxy terminal group.

14. A bottom anti-reflective coating material composition for a photoresist as claimed in claim 1, wherein the thermal crosslinking agent of component (b) is a melamine, benzoguanamine, glycoluril or urea compound substituted with at least one substituent selected from a methylol group, an alkoxymethyl group and an acyloxymethyl group.

15. A bottom anti-reflective coating material composition for a photoresist as claimed in claim 7, wherein the thermal crosslinking agent of component (b) is a compound selected from hexamethoxymethylmelamine, tetramethoxymethylbenzoguanamine and tetramethoxymethylglycoluril.

16. A method of forming a resist pattern comprising employing the bottom anti-reflective coating material composition for a photoresist as claimed in claim 1.

17. A bottom anti-reflective coating material composition for a photoresist comprising the following components (a'), (b) and (d):

(a') a polymer containing a repeating unit including a dye structure having a molar extinction coefficient of $1.0 \times 10^4$ or more to light including a wavelength used for exposure of the photoresist and a repeating unit including a sulfonic acid ester structure or diaryl iodonium structure, which is decomposed to generate an acid with heating at temperature between 150 to 200° C.;

(b) a thermal crosslinking agent which is activated by an acid to react with component (a') described above, thereby forming a crosslinked structure; and (d) an organic solvent capable of dissolving components (a') and (b) described above.

* * * * *